United States Patent
Iwama

(10) Patent No.: US 11,198,198 B2
(45) Date of Patent: Dec. 14, 2021

(54) METHOD FOR MANUFACTURING SUBSTRATE WITH TRANSPARENT CONDUCTIVE FILM, SUBSTRATE WITH TRANSPARENT CONDUCTIVE FILM, AND SOLAR CELL

(71) Applicant: FURUKAWA ELECTRIC CO., LTD., Tokyo (JP)

(72) Inventor: Masaki Iwama, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/804,309

(22) Filed: Feb. 28, 2020

(65) Prior Publication Data
US 2020/0198063 A1    Jun. 25, 2020

Related U.S. Application Data

(63) Continuation of application No. PCT/JP2018/031781, filed on Aug. 28, 2018.

(30) Foreign Application Priority Data

Aug. 29, 2017 (JP) .............. JP2017-164743

(51) Int. Cl.
| | |
|---|---|
| H01L 31/18 | (2006.01) |
| B23K 26/352 | (2014.01) |
| H01B 5/14 | (2006.01) |
| H01L 31/0224 | (2006.01) |

(52) U.S. Cl.
CPC ............ B23K 26/355 (2018.08); H01B 5/14 (2013.01); H01L 31/022475 (2013.01); H01L 31/1888 (2013.01)

(58) Field of Classification Search
CPC . H01L 31/1884; H01L 31/1888; B23K 26/00; B23K 26/355
See application file for complete search history.

(56) References Cited

U.S. PATENT DOCUMENTS

| | | | |
|---|---|---|---|
| 10,187,980 B2* | 1/2019 | Wada ............... | H05K 1/0296 |
| 2018/0007786 A1* | 1/2018 | Wada ............... | H05K 3/027 |

(Continued)

FOREIGN PATENT DOCUMENTS

| | | |
|---|---|---|
| CN | 102227817 A | 10/2011 |
| CN | 102969408 A | 3/2013 |
| JP | 2005-108668 A | 4/2005 |

(Continued)

OTHER PUBLICATIONS

Cerkauskaite et al., Form-Birefringence in ITO Thin Films Engineered by Ultrafast Laser Nanostructuring, ACS Photonics, 2017, 9 pages (Year: 2017).*

(Continued)

*Primary Examiner* — Earl N Taylor
(74) *Attorney, Agent, or Firm* — Oblon, McClelland, Maier & Neustadt, L.L.P.

(57) ABSTRACT

A method for manufacturing a substrate with a transparent conductive film, includes emitting subnano-to-nanosecond laser light to a transparent conductive film formed on a surface of a substrate to form a laser-induced periodic surface structure having a corrugated shape in at least a part of the transparent conductive film.

5 Claims, 10 Drawing Sheets

(56) References Cited

U.S. PATENT DOCUMENTS

2019/0381767 A1\* 12/2019 Legois .............. B32B 17/10137
2020/0198063 A1\* 6/2020 Iwama ................... B32B 38/18

FOREIGN PATENT DOCUMENTS

| JP | 2012-204646 A | 10/2012 | | |
|---|---|---|---|---|
| JP | 2016-190392 A | 11/2016 | | |
| JP | 2016-192392 A | 11/2016 | | |
| JP | 2019046541 A | \* 3/2019 | .............. | H01B 5/14 |
| WO | WO-2019044840 A1 | \* 3/2019 | .............. | B32B 7/02 |

OTHER PUBLICATIONS

Pan et al., Formation of high-spatial-frequency periodic surface structures on indium-tin-oxide films using picosecond laser pulses, Materials and Design, 121, 2017, pp. 126-135 (Year: 2017).\*
International Search Report dated Nov. 6, 2018 in PCT/JP2018/031781 filed Aug. 28, 2018, 1 page.
Combined Chinese Office Action and Search Report dated Dec. 3, 2020, in Chinese Patent Application No. 201880054121.0 (with English translation), 14 pages.
Japanese Office Action dated Mar. 9, 2021 in Japanese Patent Application No. 2017-164743 (with unedited computer generated English translation), 5 pages.

\* cited by examiner

METHOD FOR MANUFACTURING SUBSTRATE WITH TRANSPARENT CONDUCTIVE FILM, SUBSTRATE WITH TRANSPARENT CONDUCTIVE FILM, AND SOLAR CELL

CROSS-REFERENCE TO RELATED APPLICATION(S)

This application is based on a continuation of International Application No. PCT/JP2018/031781, filed on Aug. 28, 2018, the entire contents of which are incorporated herein by reference.

BACKGROUND

The present disclosure relates to a method for manufacturing a substrate with a transparent conductive film, a substrate with a transparent conductive film, and a solar cell.

Flat panel displays, such as liquid crystal displays and organic electroluminescent (EL) displays, and solar cells use a substrate with a transparent conductive film having a transparent conductive film, such as an indium tin oxide (ITO) film formed on a transparent substrate made of, for example, glass. The transparent conductive film is formed in a predetermined pattern on a surface of the substrate with the transparent conductive film. The transparent conductive film is patterned by, for example, laser processing. In the case of the laser processing, laser light is emitted to the transparent conductive film on the surface of the substrate to provide energy to the transparent conductive film so as to partially remove and pattern the transparent conductive film. An insulating protection film is formed on the surface of the substrate exposed after the transparent conductive film is removed.

Japanese Laid-open Patent Publication No. 2016-190392 discloses a technique for forming island portions where the transparent conductive film is formed in an island shape in a boundary region between a removal region obtained by removing the transparent conductive film and the transparent conductive film, and using an anchoring effect of the island portions to make the protection film more difficult to be peeled off. Japanese Laid-open Patent Publication No. 2016-190392 discloses that, in order to prevent heat from diffusing across a peripheral portion, ultrashort pulsed laser light having a pulse width of 10 picoseconds or less, preferably of a femtosecond order, is used to pattern a transparent electrode.

However, the island portions of the transparent conductive film formed by the above-described ultrashort pulsed laser light have a small size. Therefore, in some cases, the transparent conductive film in the boundary region may have a small corrugated shape; the transparent conductive film is likely to remain between the islands; and the islands may not be fully separated. As a result, the anchoring effect may be insufficient. Since the ultrashort pulsed laser light has a small amount of energy per pulse, the patterning by removing the transparent electrode may take time. Assuming the same amount of energy per pulse, the ultrashort pulsed laser light has a higher peak value as the pulse width is shorter. Therefore, a portion of the ultrashort pulsed laser light having a high peak value may give damage to the substrate. To prevent such damage, the peak value needs to be reduced to an extent not damaging the substrate. However, since doing so reduces the amount of energy per pulse, the patterning takes more time. If the patterning takes more time as described above, time for manufacturing the substrate with the transparent conductive film increases, and manufacturability decreases. As a result, manufacturing cost of the substrate with the transparent conductive film increases.

In the case of the ultrashort pulsed laser light, coping with the ultrashort pulse width requires expensive peripheral devices, such as a laser device itself for outputting the ultrashort pulsed laser light and a lens used together with the laser device, which thereby increases equipment cost. As a result, a substrate with a transparent conductive film to be manufactured also increases in cost.

SUMMARY

There is a need for providing a method for manufacturing a substrate with a transparent conductive film capable of shaping the transparent conductive film at low cost and in a suitable manner, a low-cost substrate with a transparent conductive film having the transparent conductive film having a suitable shape, and a solar cell using the substrate with the transparent conductive film.

According to an embodiment, a method for manufacturing a substrate with a transparent conductive film includes emitting subnano-to-nanosecond laser light to a transparent conductive film formed on a surface of a substrate to form a laser-induced periodic surface structure having a corrugated shape in at least a part of the transparent conductive film.

According to an embodiment, a substrate with a transparent conductive film, includes: a substrate; and a transparent conductive film formed on a surface of the substrate. Further, an exposed region where the substrate is not covered with the transparent conductive film and a coated region where the substrate is covered with the transparent conductive film are formed on the surface of the substrate, and a boundary region between the exposed region and the coated region has a corrugated structure in which removed portions and remaining portions are alternately arranged in a direction in which the boundary region extends, the direction intersecting a predetermined direction, the removed portions extending in the predetermined direction and being portions where the transparent conductive film has been removed, the remaining portions extending in the predetermined direction and being portions where the transparent conductive film remains.

According to an embodiment, a substrate with a transparent conductive film, includes: a substrate; and a transparent conductive film formed on a surface of the substrate. Further, the substrate with a transparent conductive film has a corrugated structure in which removed portions and remaining portions are alternately arranged in a direction intersecting a predetermined direction, the removed portions extending in the predetermined direction and being portions where the transparent conductive film has been removed, the remaining portions extending in the predetermined direction and being portions where the transparent conductive film remains, and the transparent conductive film has a predetermined pattern shape formed by the removed portions and the remaining portions.

DETAILED DESCRIPTION

Figure 1:
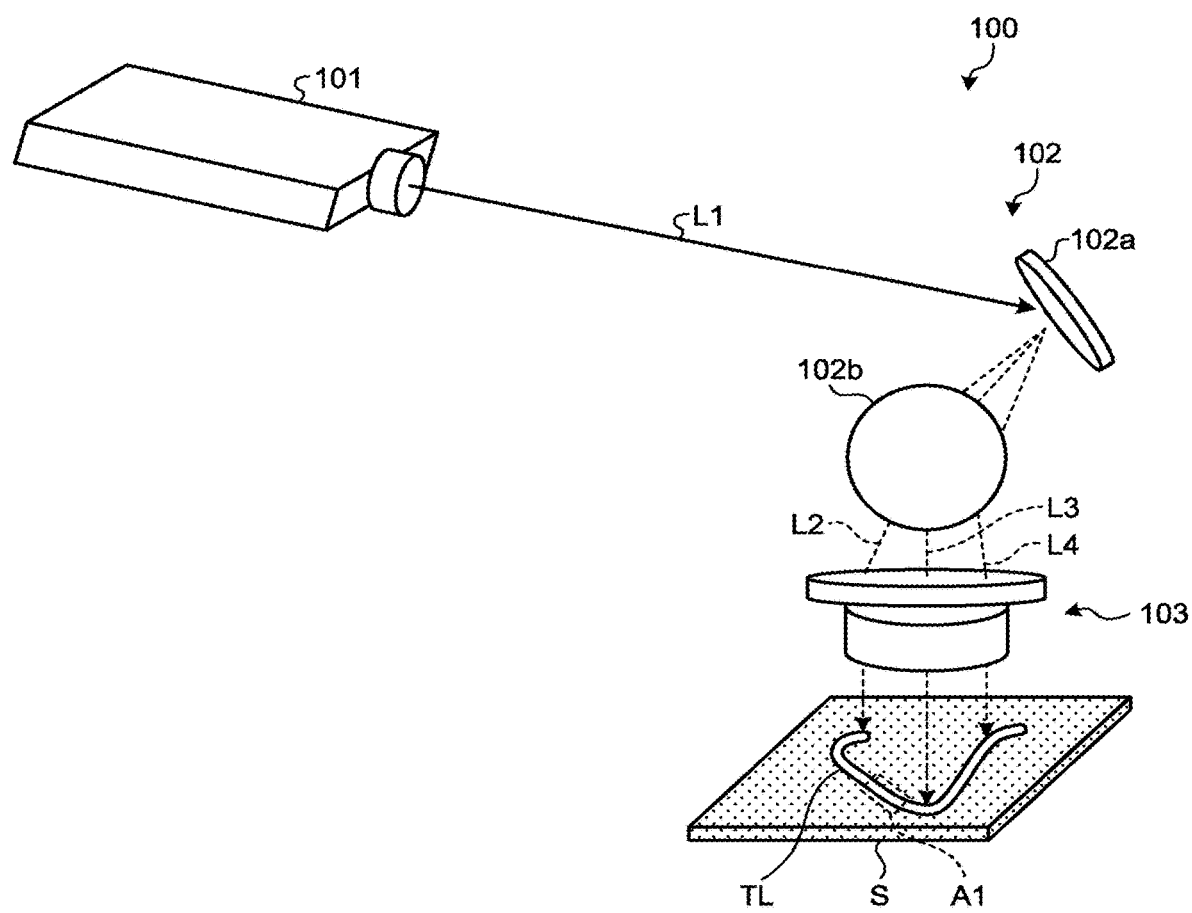
FIG. 1 is a diagram illustrating a method of manufacturing a substrate with a transparent conductive film according to a first embodiment of the present disclosure.

The following describes embodiments of the present disclosure with reference to the drawings. The embodiments do not limit the present disclosure. In the description of the drawings, the same or corresponding elements are denoted by the same reference numerals as appropriate. It should be noted that the drawings are merely schematic, and, for example, relations among dimensions of the elements and ratios among the elements may differ from actual relations and ratios. The drawings may also include portions different from one another in the relations among dimensions and the ratios.

First Embodiment

FIG. 1 is a diagram illustrating a method for manufacturing a substrate with a transparent conductive film according to a first embodiment of the present disclosure. The manufacturing method according to the first embodiment is a method in which a processing device 100 applies predetermined patterning to a transparent conductive film of a substrate with the transparent conductive film formed on the entire surface of the substrate to manufacture the substrate with the transparent conductive film (to be described below). The processing device 100 includes a laser device 101, a galvano scanner 102, and an fθ lens 103.

The laser device 101 includes a laser light source, such as an optical fiber laser, and outputs laser light L1 that is subnano-to-nanosecond pulse laser light having a pulse width in a range from 0.1 nanosecond to 999 nanoseconds. The laser device 101 includes a polarization controller such as a polarizer for adjusting a polarization direction of the laser light L1 and a beamformer for adjusting a shape of a beam of the laser light L1. The beamformer is configured using, for example, a diffractive optical element (DOE).

The galvano scanner 102 includes galvano mirrors 102a and 102b each rotationally driven by an electric motor, and reflects the laser light L1 output from the laser device 101 on the rotating galvano mirrors 102a and 102b to cause the laser light L1 to make scanning. FIG. 1 illustrates the scanning laser light L1 as laser light L2, L3, and L4.

The fθ lens 103 focuses the laser light caused by the galvano scanner 102 to make constant angle scanning on a predetermined plane, and causes the laser light to make constant speed scanning in the plane. Since the predetermined plane is set to coincide with a surface of a substrate with a transparent conductive film S placed on a stage (not illustrated), the laser light L1 (laser light L2, L3, or L4) is emitted by the fθ lens 103 in a state focused on the surface of the substrate with a transparent conductive film S, and makes scanning so as to follow a trajectory TL. A predetermined pattern can be formed in the transparent conductive film by emitting the subnano-to-nanosecond pulse laser light L1 to the transparent conductive film formed on the surface of the substrate with a transparent conductive film S to partially remove the transparent conductive film.

Figure 2A:
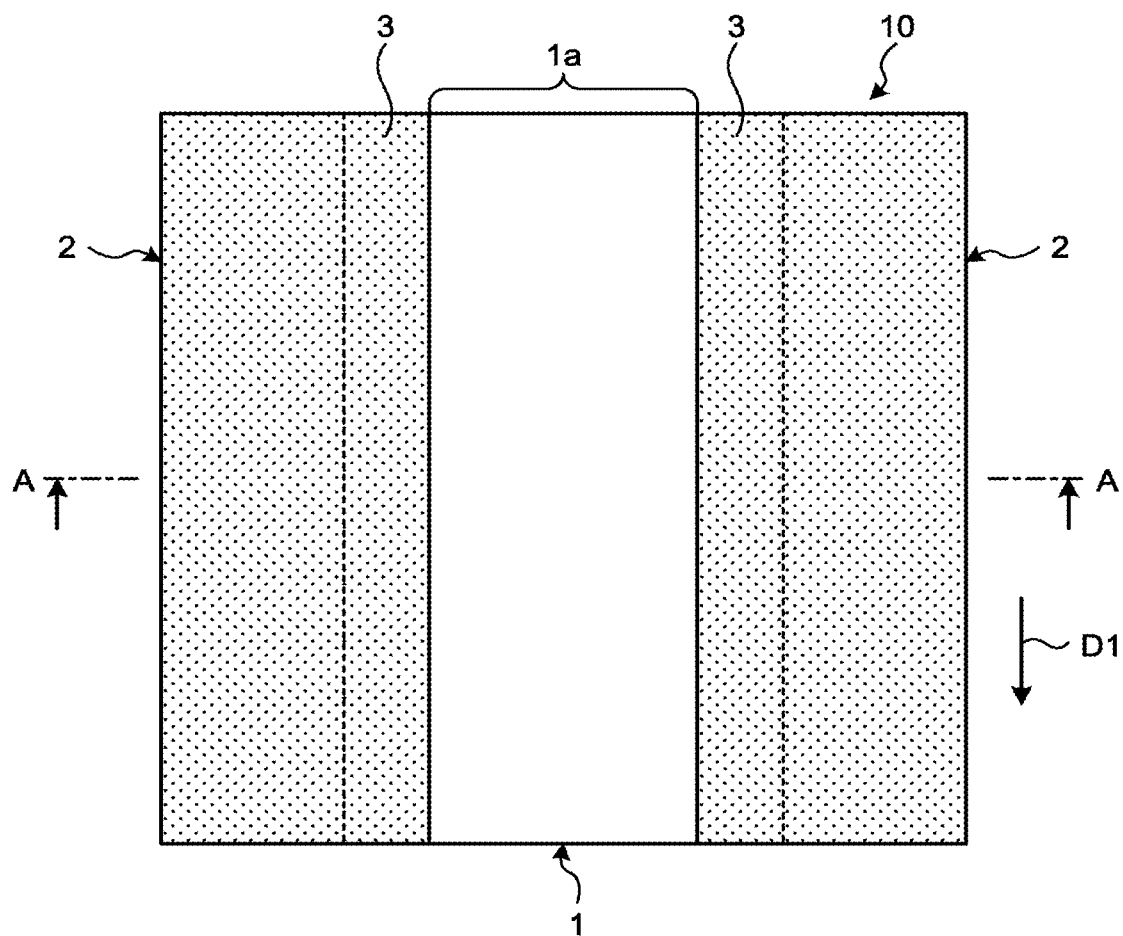
FIG. 2A is a schematic view of a substrate with a transparent conductive film manufactured using the manufacturing method according to the first embodiment.
Figure 2B:
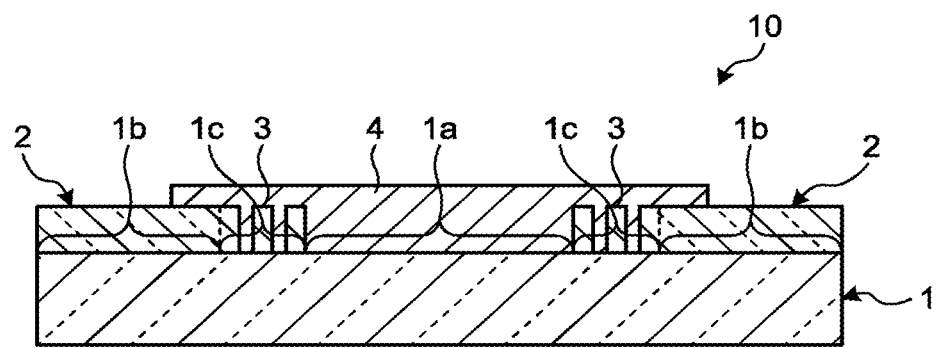
FIG. 2B is another schematic view of the substrate with a transparent conductive film manufactured using the manufacturing method according to the first embodiment.

FIGS. 2A and 2B are schematic views of a substrate with a transparent conductive film 10 manufactured using the manufacturing method according to the first embodiment. FIG. 2A is a top view of a portion corresponding to an area A1 of the substrate with a transparent conductive film S in FIG. 1. FIG. 2B is an A-A line sectional view of FIG. 2A.

The substrate with the transparent conductive film 10 includes a substrate 1 and a transparent conductive film 2. The substrate 1 is a substrate constituted by a transparent material such as glass. The transparent conductive film 2 is a film constituted by a transparent conductive material, such as indium tin oxide (ITO) or a zinc oxide (ZnO)-based material, and is patterned by the laser light L1 to be formed into the predetermined pattern on a surface of the substrate 1.

An exposed region 1a where the substrate 1 is not covered with the transparent conductive film 2 and a coated region 1b where the substrate 1 is covered with the transparent conductive film 2 are formed on the surface of the substrate with the transparent conductive film 10. The exposed region 1a is a region where the transparent conductive film 2 is removed by the laser light L1 illustrated in FIG. 1, and is formed along a direction D1 (refer to FIG. 2A) serving as a scanning direction of the laser light L1.

In addition, the substrate with the transparent conductive film 10 has a corrugated structure 3 in a boundary region 1c between the exposed region 1a and the coated region 1b. The corrugated structure 3 will be described later.

In addition, as illustrated in FIG. 2B, the substrate with the transparent conductive film 10 includes a protection film 4. The protection film 4 is formed so as to cover the exposed region 1a, the corrugated structure 3, and a part of the transparent conductive film 2 on the surface of the substrate 1. The protection film 4 is constituted by an insulating material. Examples of the insulating material include inorganic materials, such as a silicon nitride, a silicon oxide, a silicon oxynitride, and an aluminum oxide, and organic materials, such as an epoxy resin, an acrylic resin, and a urethane resin. FIG. 2A does not illustrate the protection film 4. The protection film 4 can be formed using a known method after patterning the transparent conductive film 2 using the laser light L1.

Figure 3:
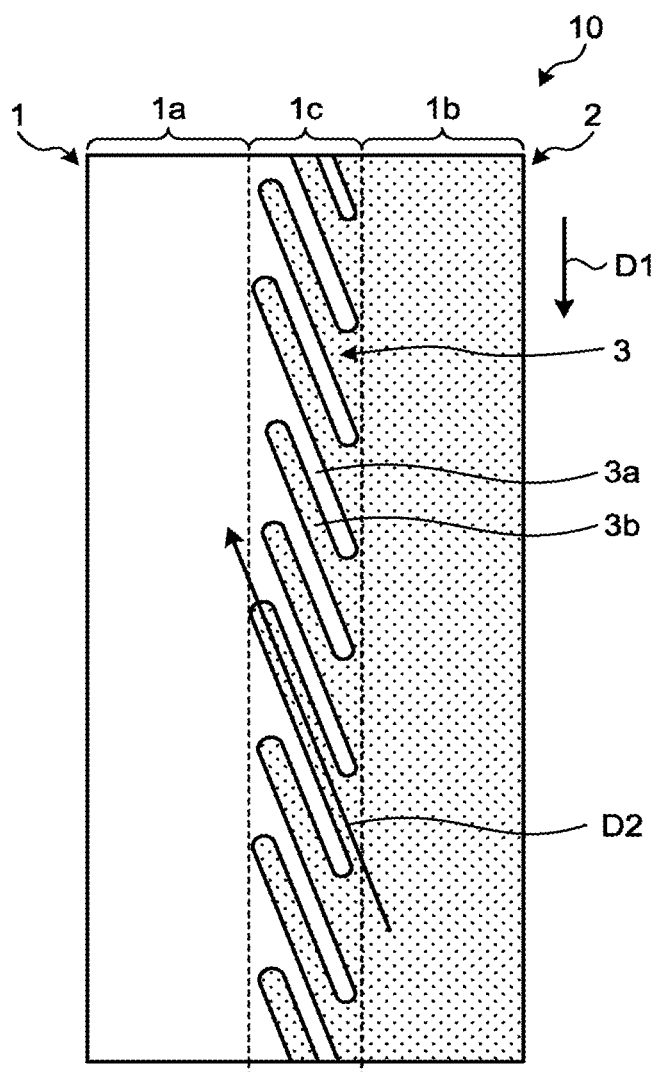
FIG. 3 is a view illustrating a relationship between a corrugated structure and fluence.
Figure 3:
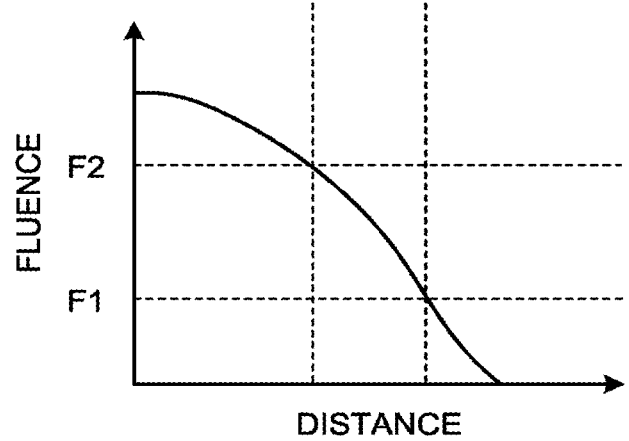

The following specifically describes the corrugated structure 3. As illustrated in FIG. 3, the corrugated structure 3 in the boundary region 1c has a corrugated shape in which removed portions 3a and remaining portions 3b extending in a direction D2 are alternately arranged in the direction D1 intersecting the direction D2. The removed portions 3a are portions where the transparent conductive film 2 has been removed by the laser light L1, and the remaining portions 3b are portions where the transparent conductive film 2 remains without being removed by the laser light L1. The remaining portions 3b are connected to the transparent conductive film 2 in the coated region 1b. The direction D1 is the scanning direction of the laser light L1 as described above, and is the same as the direction in which the boundary region 1c extends.

The corrugated structure 3 described above is what is called a laser-induced periodic surface structure (LIPSS), and is generated by interference of the laser light L1. In the corrugated structure 3, the removed portions 3a or the remaining portions 3b are substantially periodically arranged at substantially the same intervals as those of a wavelength of the laser light L1. For example, when the wavelength of the laser light L1 is 1070 nm, the removed portions 3a or the remaining portions 3b are also arranged at intervals of approximately 1 µm. The removed portions 3a or the remaining portions 3b are arranged at intervals in a range of, for example, 0.3 µm to 3.0 µm (at a period d) by changing the wavelength of the laser light L1. The direction D2 can be adjusted by setting the polarization direction of the laser light L1. When θ denotes an angle formed between the direction D1 serving as the scanning direction of the laser light L1 and the direction D2 serving as the direction in which the removed portions 3a and the remaining portions 3b extend, a width w of the boundary region 1c has a lower limit value of d/cos θ. A length l of the remaining portions 3b is given as w/sin θ=d/sin θ·cos θ. The values of the width w and the length l are derived by substituting a value in the range of 0.3 µm to 3.0 µm serving as the range of the period d into the expression given above.

The corrugated structure 3 described above can be formed by controlling a fluence of the laser light L1 when the laser light L1 is emitted to the transparent conductive film 2 formed on the surface of the substrate 1. The term "fluence" refers to an amount of energy per unit area in a section of a beam of laser light, and the unit thereof is, for example, $J/cm^2$ or $W/cm^2$.

A relation between the corrugated structure and the fluence will be described with reference to FIG. 3. FIG. 3 illustrates a graph of a distribution of the fluence of the laser light L1 corresponding to the exposed region 1a, the boundary region 1c, and the coated region 1b. The horizontal axis represents a distance from the center of the beam of the laser light L1, and the vertical axis represents the fluence. As can be found from FIG. 3, the beam of the laser light L1 includes a region where the fluence is equal to or higher than a value F2, a region where the fluence is lower than the value F2 and higher than a value F1, and a region where the fluence is equal to or lower than the value F1. In the region where the fluence of the laser light L1 is higher than the value F2, the laser light L1 provides a large amount of energy to the transparent conductive film 2, so that the transparent conductive film 2 is removed. This removal forms the exposed region 1a. In the region where the fluence of the laser light L1 is lower than the value F1, the laser light L1 provides a small amount of energy to the transparent conductive film 2, so that the transparent conductive film 2 is not removed. In the region where the fluence of the laser light L1 is lower than the value F2 and higher than the value F1, the laser light L1 provides an amount of energy capable of forming the LIPSS to the transparent conductive film 2, so that the corrugated structure 3 is formed. In this way, the corrugated structure 3 can be formed by controlling the fluence of the laser light L1 such that the fluence of at least a part of the beam of the laser light L1 on an irradiated surface of the transparent conductive film 2 is set to a value between the fluence value F2 capable of removing the transparent conductive film 2 and the fluence value F1 incapable of removing the transparent conductive film 2. The values F1 and F2 are values determined according to, for example, a material and a thickness of the transparent conductive film 2.

Figure 4:
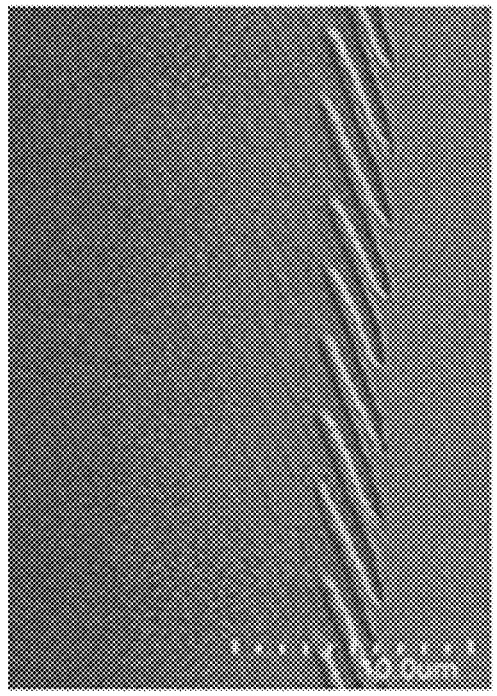
FIG. 4 is a view illustrating a micrograph of the corrugated structure.

FIG. 4 is a view illustrating a micrograph of the substrate with a transparent conductive film obtained when the inventors of the present disclosure emitted laser light having a wavelength of 1550 nm and a pulse width of 1.6 ns to the substrate with a transparent conductive film having a glass substrate with an ITO film formed thereon. FIG. 4 displays scales for indicating the size, and one division of the scale is 1.0 µm. It can be found from FIG. 4 that the transparent conductive film is removed to form the exposed region in a left-side region of the photograph; the corrugated structure having a period of approximately 1 µm is formed in a region on a slightly right side relative to the center; and the transparent conductive film remains in a right-side region.

Figure 5A:
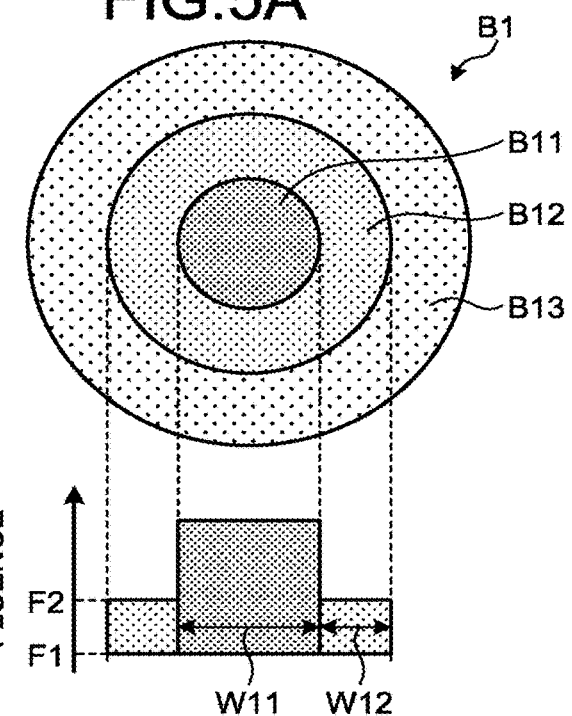
FIG. 5A is a diagram illustrating the fluence of laser light.
Figure 5B:
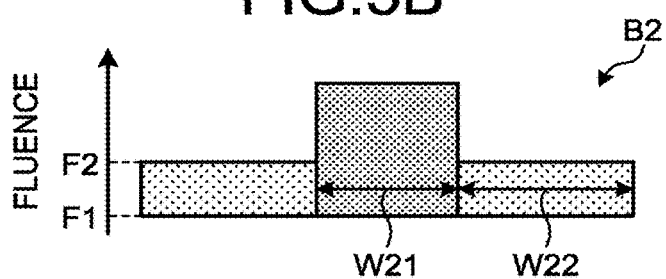
FIG. 5B is another diagram illustrating the fluence of the laser light.
Figure 5C:
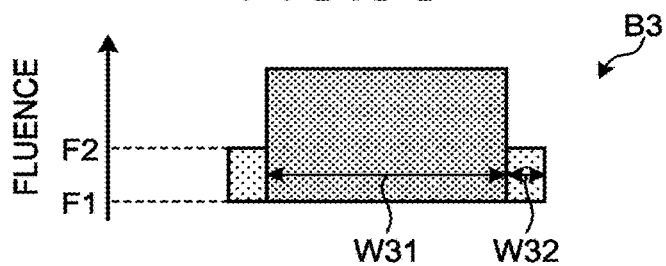
FIG. 5C is still another diagram illustrating the fluence of the laser light.

The following describes the fluence of the laser light for forming the corrugated structure 3 formed by the LIPSS. FIGS. 5A to 5D are diagrams illustrating the fluence of the laser light. FIG. 5A is a diagram illustrating the fluence in each region of a beam B1 of the laser light L1 on the irradiated surface of the transparent conductive film 2. A central region B11 of the beam B1 has a fluence that is equal to or higher than the value F2, and that is capable of removing the transparent conductive film 2. A first surrounding region B12 located around the central region B11 has a fluence that is lower than the value F2 and higher than the value F1, and that is capable of forming the corrugated structure 3 formed as the LIPSS. Furthermore, a second surrounding region B13 located around the first surrounding region B12 has a fluence that is equal to or lower than the value F1, and that is incapable of removing the transparent conductive film 2. Although the actual beam of the laser light has a continuously varying fluence, FIGS. 5A to 5D illustrate the fluence in a stepwise manner using the values F1 and F2 as thresholds.

For example, when the laser light L1 including the beam B1 having the fluence illustrated in FIG. 5A is emitted to the transparent conductive film 2 and makes scanning, the width of the formed exposed region 1a is set to a width W11 serving as a diameter of the central region B11, and the width of the formed corrugated structure 3 is set to a width W12 serving as a width of the first surrounding region B12. In this way, the substrate with the transparent conductive film 10 configured as illustrated in FIGS. 2A and 2B can be formed by controlling the fluence of the laser light L1 such that the beam B1 of the laser light L1 includes the central region B11, the first surrounding region B12, and the second surrounding region B13.

The distribution of the fluence in the beam of the laser light L1 can be changed by adjusting the output of the laser light source included in the laser device 101 and setting the characteristics of the beamformer included in the laser device 101. For example, as illustrated as a beam B2 in FIG. 5B, the adjustment can be made such that a width W22 of the region having the fluence lower than the value F2 and higher than the value F1 is larger than a width W21 of the region having the fluence equal to or higher than the value F2. Alternatively, as illustrated as a beam B3 in FIG. 5C, the adjustment can be made such that a width W32 is smaller than a width W31. In this way, a ratio between the width (width W11, W21, or W31) at which the transparent conductive film 2 is removed and the width (width W12, W22, or W32) at which the LIPSS is formed can be controlled by controlling the width (width W12, W22, or W32) of the region in the beam (beam B1, B2, or B3) of the laser light L1 having the fluence capable of forming the LIPSS.

Figure 5D:
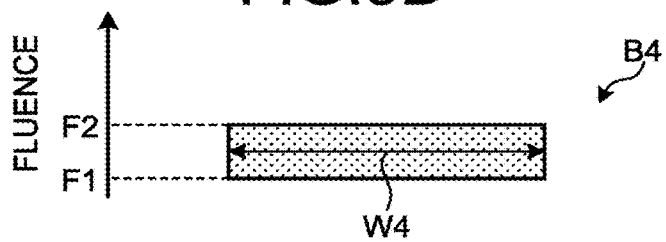
FIG. 5D is still another diagram illustrating the fluence of the laser light.

In addition, as illustrated in FIG. 5D, a beam B4 of the laser light L1 can be adjusted such that the fluence is lower than the value F2 and higher than the value F1 in a region having a width W4, and no region has a fluence equal to or higher than the value F2. An example of the corrugated structure formed by the laser light L1 having a beam as exemplified by the beam B4 will be described later as a second embodiment of the present disclosure.

While a case where the beam of the laser light L1 is circular has been described with reference to FIGS. 5A to 5D, the beam of the laser light L1 is not limited to the circular shape, and can have various shapes formable by the beamformer.

The manufacturing method according to the first embodiment allows forming of the corrugated structure 3 serving as the LIPSS to be formed at the same time as the patterning of the transparent conductive film 2. In the corrugated structure 3, unlike the island portions such as those of Japanese Laid-open Patent Publication No. 2016-190392, the removed portions 3a of the transparent conductive film are totally removed, and form the remaining portions 3b that are fully separated from each other. As a result, a macroscopic structure having a large height difference in a depth direction is reliably formed in the corrugated structure 3, so that a high anchoring effect is obtained for the protection film 4. The width of the corrugated structure 3 can be easily adjusted, so that the degree of the anchoring effect can be easily adjusted. In addition, since the laser light L1 is the subnano-to-nanosecond pulse laser light, the amount of energy per pulse can be set relatively large while reducing the peak value to an extent not damaging the substrate. As a result, the time required for the patterning can be reduced, and the equipment cost can also be reduced. The beamformer can also be prepared at low cost. Accordingly, in the manufacturing of the substrate with the transparent conductive film 10, the transparent conductive film 2 can be shaped at low cost and in a suitable manner. The substrate with the transparent conductive film 10 to be manufactured is low cost and has the suitably shaped transparent conductive film 2.

Second Embodiment

Figure 6:
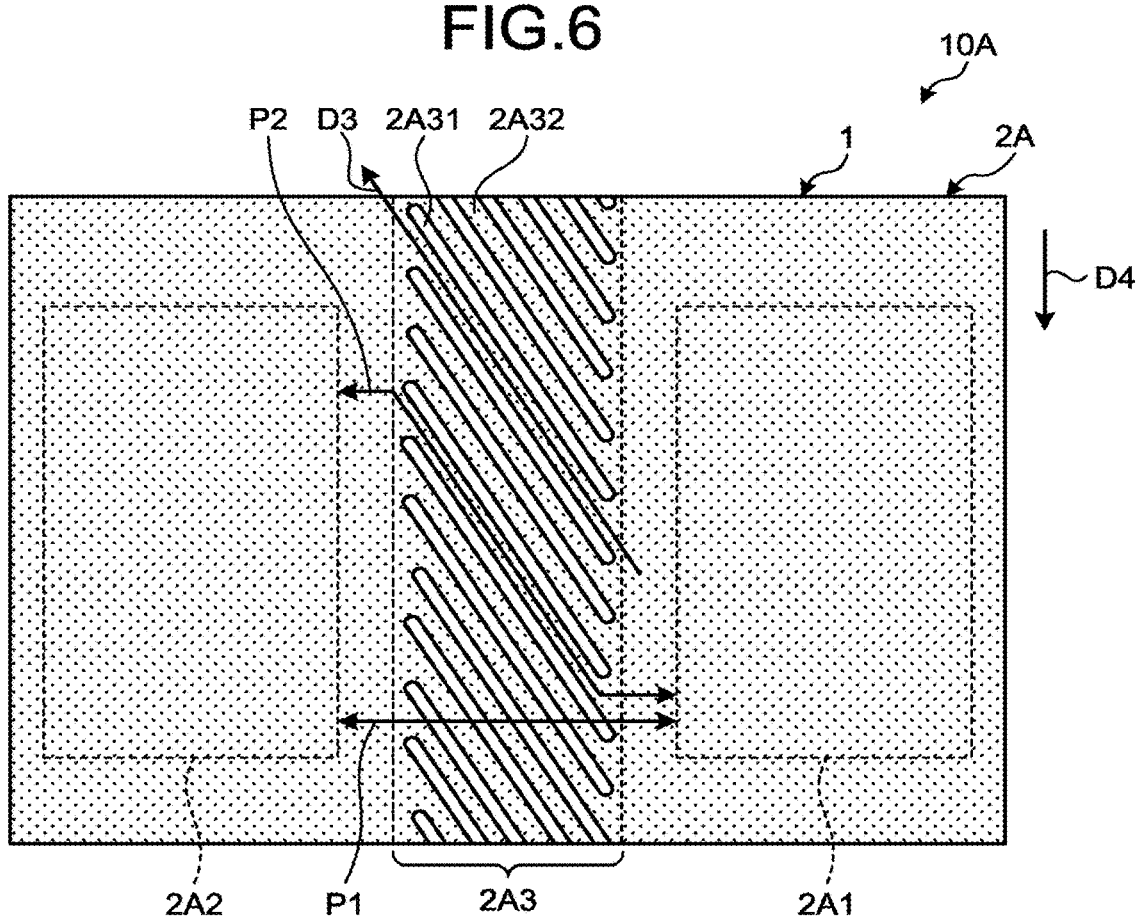
FIG. 6 is a schematic view of a substrate with a transparent conductive film according to a second embodiment of the present disclosure.

FIG. 6 is a schematic view of a substrate with a transparent conductive film 10A according to a second embodiment, and is a top view of a part of the substrate with the transparent conductive film 10A.

The substrate with the transparent conductive film 10A includes the substrate 1 and a transparent conductive film 2A formed on the surface of the substrate 1. The transparent conductive film 2A is a film constituted by the same transparent conductive material as that of the transparent conductive film 2.

The transparent conductive film 2A includes a region 2A1 serving as a first region, a region 2A2 serving as a second region, and a region 2A3 located between the region 2A1 and the region 2A2.

In the region 2A3, the transparent conductive film 2A has a corrugated structure in which removed portions 2A31 and remaining portions 2A32 extending in a direction D3 are alternately arranged in a direction D4 intersecting the direction D3 at an angle other than 90 degrees. The removed portions 2A31 are portions where the transparent conductive film 2A has been removed by the laser light L1, and the remaining portions 2A32 are portions where the transparent conductive film 2A remains without being removed by the laser light L1. The remaining portions 2A32 are electrically connected to the region 2A1 and the region 2A2. The direction D4 is the scanning direction of the laser light L1. This corrugated structure is the LIPSS formed by causing the laser light L1 to make scanning between the region 2A1 and the region 2A2, and the removed portions 2A31 or the remaining portions 2A32 are substantially periodically arranged at substantially the same intervals as those of the wavelength of the laser light L1.

In the region 2A3, the transparent conductive film 2A has a pattern shape in which the removed portions 2A31 and the remaining portions 2A32 provide a predetermined value of electrical resistance between the region 2A1 and the region 2A2.

A specific description will be given below. If the corrugated structure is not present in the transparent conductive film, the electrical resistance value between two regions of the transparent conductive film separated from each other is a value normally determined according to electrical resistivity of a constituent material of the transparent conductive film and a distance between the two regions.

In the case of the transparent conductive film 2A, however, the electrical resistance value between the region 2A1 and the region 2A2 is a value determined according to the electrical resistivity of the constituent material of the transparent conductive film 2A, the distance between the region 2A1 and the region 2A2, and the shape of the corrugated structure in the region 2A3. Specifically, when a current flows between the region 2A1 and the region 2A2, the current path is not a path P1 connecting the region 2A1 to the region 2A2 at the shortest distance, but a path P2 passing through at least one of the remaining portions 2A32 of the region 2A3. The length of the path P2 is greater than the length of the path P1, and the transparent conductive film 2A has a smaller width in the remaining portions 2A32. Accordingly, the electrical resistance value between the region 2A1 and the region 2A2 is higher than that when the corrugated structure is not present in the region 2A3.

In this way, the electrical resistance value between the region 2A1 and the region 2A2 can be adjusted by forming the LIPSS in the region 2A3 between the region 2A1 and the region 2A2. The electrical resistance value can also be adjusted by setting the intervals of the arrangement of the removed portions 2A31 or the remaining portions 2A32, or by setting the direction D3 in which the removed portions 2A31 and the remaining portions 2A32 extend. In other words, the path P2 is lengthened with an increase in angle of the direction D3 with respect to the path P1 connecting the region 2A1 to the region 2A2 at the shortest distance, so that the electrical resistance value can increase. Since the direction D3 can be adjusted by setting the polarization direction of the laser light L1, the direction D3 can be easily adjusted by the polarization controller included in the laser device 101.

The corrugated structure serving as the LIPSS as described above can be formed by the laser light L1 including no region having the fluence equal to or higher than the value F2 as exemplified by the beam B4 illustrated in FIG. 5D.

Figure 7:
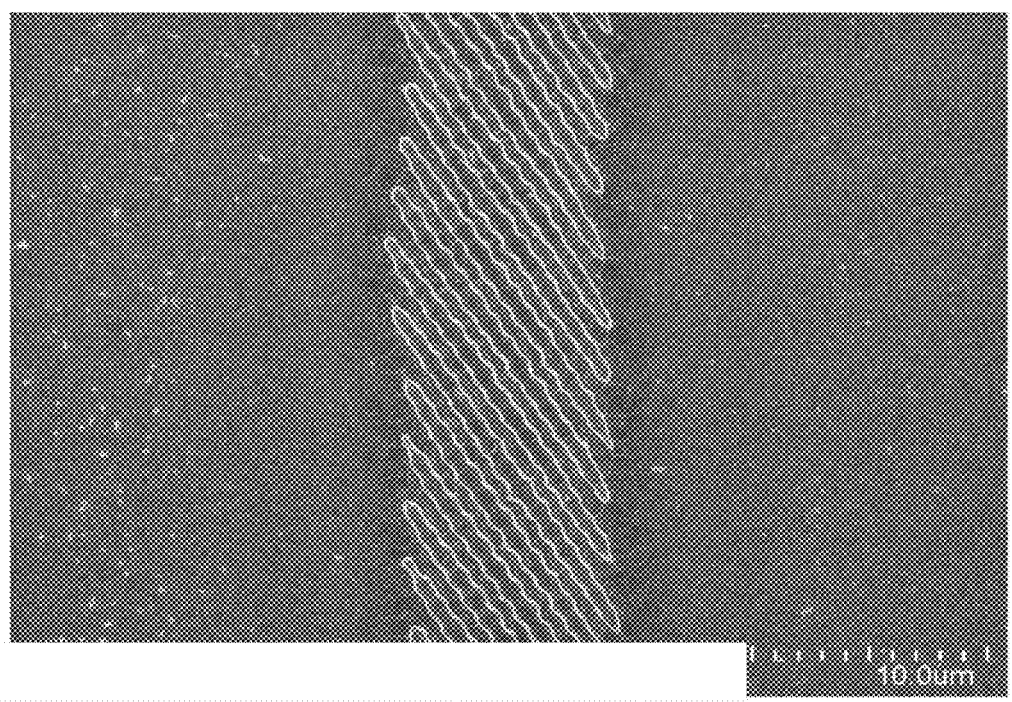
FIG. 7 is a view illustrating a photograph of the corrugated structure.

FIG. 7 is a view illustrating a micrograph of the substrate with a transparent conductive film obtained when the inventors of the present disclosure emitted the laser light having the wavelength of 1550 nm and the pulse width of 1.6 ns to the substrate with a transparent conductive film having the glass substrate with the ITO film formed thereon. FIG. 7 displays scales for indicating the size, and one division of the scale is 1.0 μm. It can be found from FIG. 7 that the corrugated structure having a period of approximately 1 μm is formed in a central region of the photograph.

Third Embodiment

Figure 8:
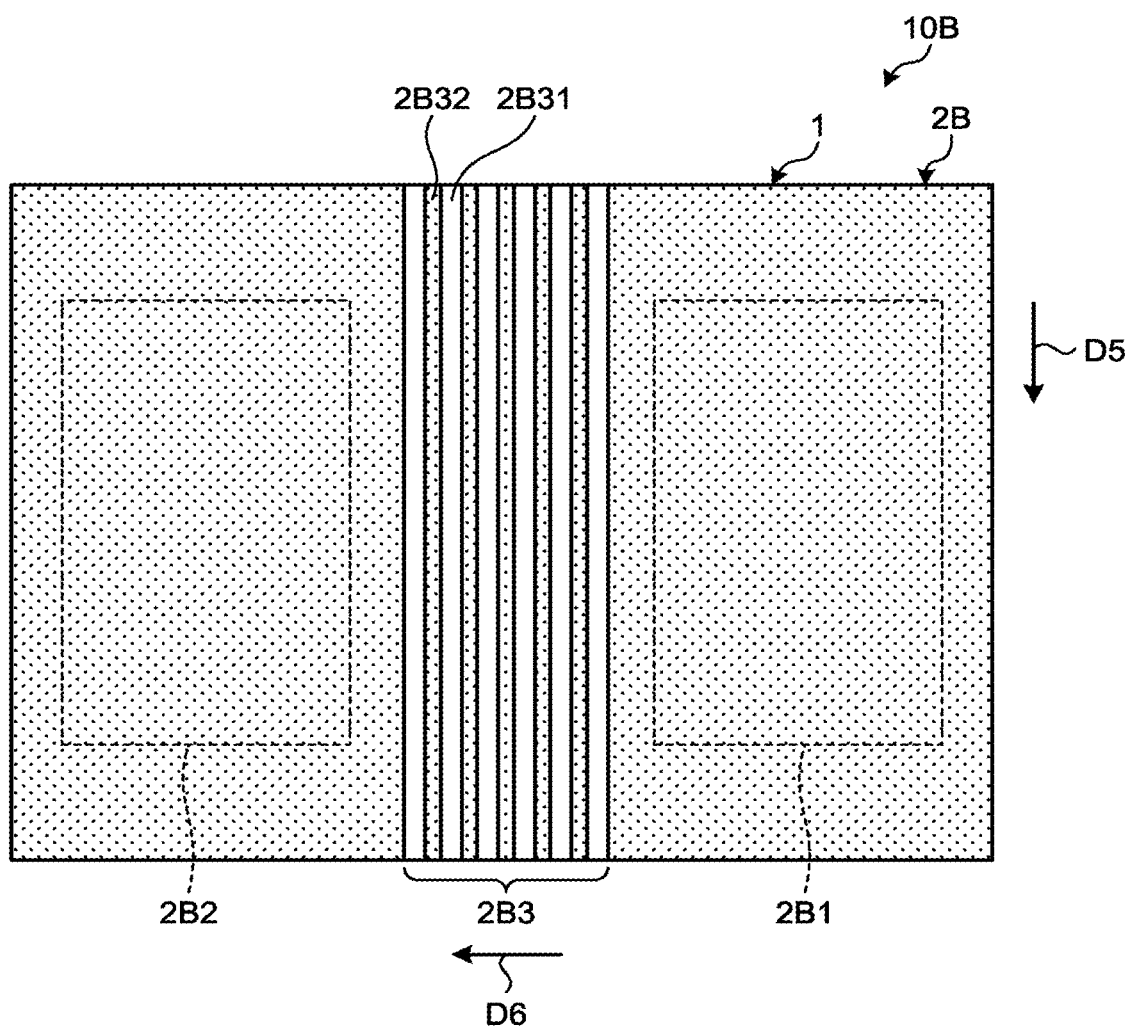
FIG. 8 is a schematic view of a substrate with a transparent conductive film according to a third embodiment of the present disclosure.

FIG. 8 is a schematic view of a substrate with a transparent conductive film 10B according to a third embodiment of the present disclosure, and is a top view of a part of the substrate with the transparent conductive film 10B.

The substrate with the transparent conductive film 10B includes the substrate 1 and a transparent conductive film 2B formed on the surface of the substrate 1. The transparent conductive film 2B is a film constituted by the same transparent conductive material as that of the transparent conductive film 2.

The transparent conductive film 2B includes a region 2B1 serving as the first region, a region 2B2 serving as the second region, and a region 2B3 located between the region 2B1 and the region 2B2.

In the region 2B3, the transparent conductive film 2B has a corrugated structure in which removed portions 2B31 and remaining portions 2B32 extending in a direction D5 are alternately arranged in a direction D6. The direction D6 is a direction parallel to a path connecting the region 2B1 to the region 2B2 at the shortest distance, and is orthogonal to the direction D5. The removed portions 2B31 are portions where the transparent conductive film 2B has been removed by the laser light L1, and the remaining portions 2B32 are portions where the transparent conductive film 2B remains without being removed by the laser light L1. The direction D5 is the scanning direction of the laser light L1. This corrugated structure is the LIPSS formed by causing the laser light L1 to make scanning between the region 2B1 and the region 2B2.

In the region 2B3, the transparent conductive film 2B has a pattern shape in which the removed portions 2B31 and the remaining portions 2B32 electrically isolate the region 2B1 from the region 2B2. In other words, since the plurality of removed portions 2B31 obtained by removing the transparent conductive film 2B are present between the region 2B1 and the region 2B2, the region 2B1 is electrically isolated from the region 2B2. The region 2B1 can be more reliably electrically isolated from the region 2B2 by increasing the width in the direction D6 of the region 2B3 or the number of the removed portions 2B31. In FIG. 8, the number of the removed portions 2B31 is six, but is not limited thereto.

In this way, the region 2B1 can be electrically isolated from the region 2B2 by forming the LIPSS such that the direction D5 in which the removed portions 2B31 and the remaining portions 2B32 extend is orthogonal to the direction D6 of the path connecting the removed portions 2B31 to the remaining portions 2B32 at the shortest distance. Since the direction D5 can be adjusted by setting the polarization direction of the laser light L1, the direction D5 can be easily adjusted by the polarization controller included in the laser device 101. The corrugated structure serving as the LIPSS as described above can also be formed by the laser light L1 exemplified by the beam B4 illustrated in FIG. 5D.

In the substrate with the transparent conductive film 10B, the direction D5 is orthogonal to the direction D6. However, the direction D5 need not be orthogonal to the direction D6. The angle formed between the direction D5 and the direction D6 only needs to be an angle at which the region 2B1 can be electrically isolated from the region 2B2. The length in the direction D5 of the region 2B3 only needs to be a length at which the region 2B1 can be electrically isolated from the region 2B2.

Fourth Embodiment

Figure 9A:
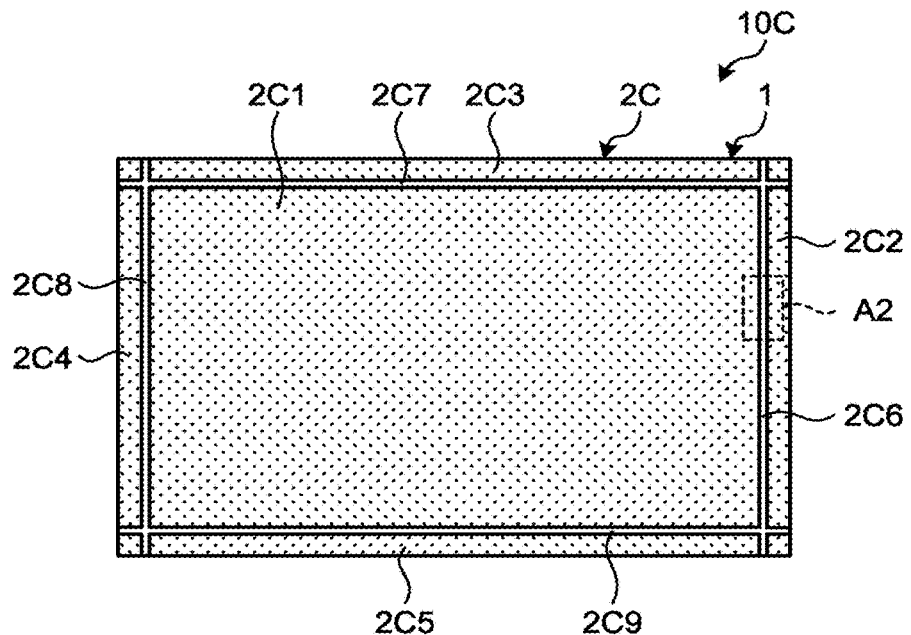
FIG. 9A is a schematic view of a substrate with a transparent conductive film according to a fourth embodiment of the present disclosure.
Figure 9B:
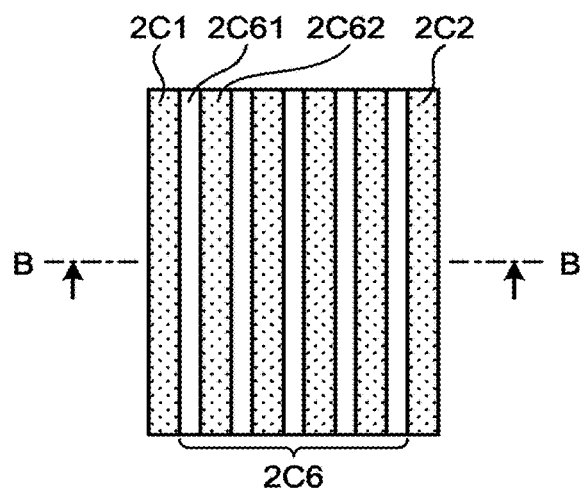
FIG. 9B is another schematic view of the substrate with a transparent conductive film according to the fourth embodiment.
Figure 9C:
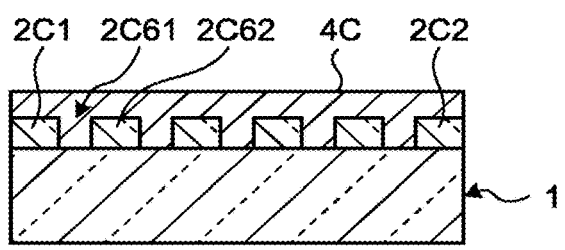
FIG. 9C is still another schematic view of the substrate with a transparent conductive film according to the fourth embodiment.

FIGS. 9A to 9C are schematic views of a substrate with a transparent conductive film 10C according to a fourth embodiment of the present disclosure. FIG. 9A is a top view of a part of the substrate with the transparent conductive film 10C. FIG. 9B is a view illustrating an area A2 of FIG. 9A that is magnified. FIG. 9C is a B-B line sectional view of FIG. 9B.

The substrate with the transparent conductive film 10C includes the substrate 1 and a transparent conductive film 2C formed on the surface of the substrate 1. The transparent conductive film 2C is a film constituted by the same transparent conductive material as that of the transparent conductive film 2.

The transparent conductive film 2C includes a region 2C1 serving as the first region, regions 2C2, 2C3, 2C4, and 2C5 serving as the second region, and regions 2C6, 2C7, 2C8, and 2C9 located between the region 2C1 and each of the regions 2C2, 2C3, 2C4, and 2C5, respectively.

As illustrated in FIG. 9B, in the region 2C6, the transparent conductive film 2C has a corrugated structure in which removed portions 2C61 and remaining portions 2C62 extending in a direction in which the region 2C6 extends are alternately arranged in a direction substantially orthogonal to the direction in which the region 2C6 extends. The removed portions 2C61 are portions where the transparent conductive film 2C has been removed by the laser light L1, and the remaining portions 2C62 are portions where the transparent conductive film 2C remains without being removed by the laser light L1. The direction in which the region 2C6 extends is the scanning direction of the laser light L1. This corrugated structure is the LIPSS formed by causing the laser light L1 to make scanning.

In the region 2C6, the transparent conductive film 2C has a pattern shape in which the removed portions 2C61 and the remaining portions 2C62 electrically isolate the region 2C1 from the region 2C2. As illustrated in FIG. 9C, the substrate with the transparent conductive film 10C includes a protection film 4C. The protection film 4C is formed so as to cover a part of each of the regions 2C1 and 2C2, as well as the region 2C6, in the transparent conductive film 2C. The protection film 4C is constituted by the same material as that of the protection film 4. FIGS. 9A and 9B do not illustrate the protection film 4C. The protection film 4C can be formed using a known method in the same way as the protection film 4.

The regions 2C7 to 2C9 have also the same corrugated structure of the LIPSS as that of the region 2C6, and have a pattern shape in which the region 2C1 is electrically isolated from each of the regions 2C3 to 2C5. In addition, the same protection film as the protection film 4C is formed so as to cover each of the regions 2C7 to 2C9 and regions on both sides thereof (the region 2C1 and any one of the regions 2C3 to 2C5).

In the same way as in the case of the third embodiment, the corrugated structure serving as the LIPSS as described above can also be formed by the laser light L1 exemplified by the beam B4 illustrated in FIG. 5D.

Each of the regions 2C6 to 2C9 electrically isolates regions on both sides thereof from each other, and the whole of the regions provide the anchoring effect for the protection films formed thereover. As described above, each of the regions 2C6 to 2C9 has both the insulating function and the anchoring function, and therefore can be more finely and more compactly provided than in a case of providing the insulating function and the anchoring function using separate structures. Accordingly, this configuration contributes to an effective use of the surface of the substrate with the transparent conductive film 10C.

Fifth Embodiment

Figure 10A:
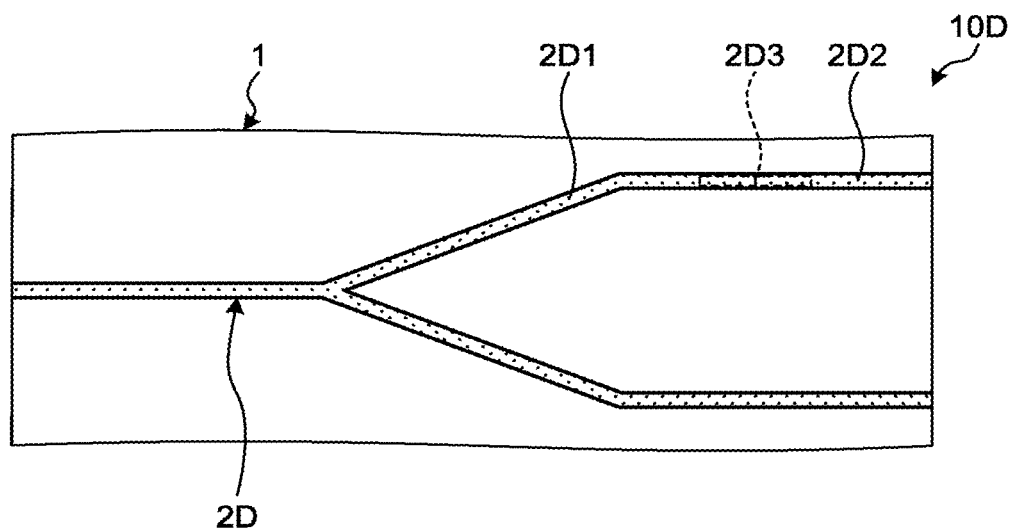
FIG. 10A is a schematic view of a substrate with a transparent conductive film according to a fifth embodiment of the present disclosure.
Figure 10B:
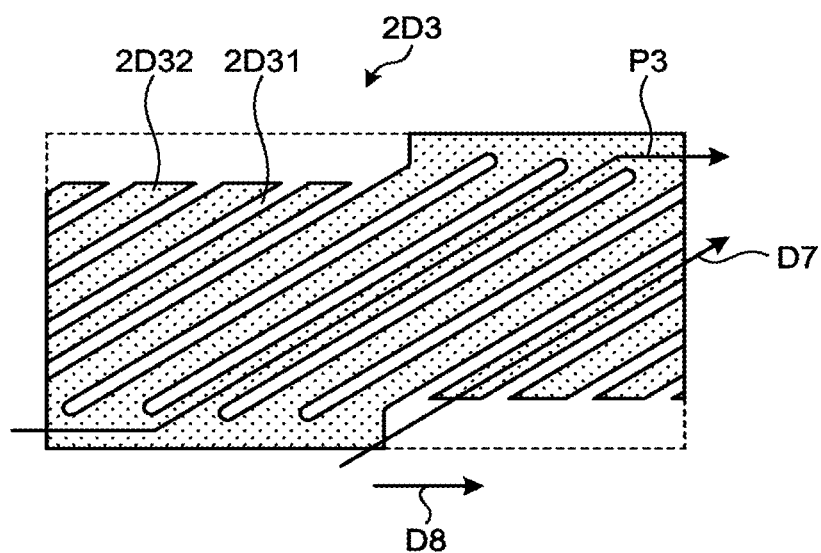
FIG. 10B is another schematic view of the substrate with a transparent conductive film according to the fifth embodiment.

FIGS. 10A and 10B are schematic views of a substrate with a transparent conductive film 10D according to a fifth embodiment of the present disclosure. FIG. 10A is a top view of a part of the substrate with the transparent conductive film 10D. FIG. 10B is a magnified view of a part of FIG. 10A.

The substrate with the transparent conductive film 10D includes the substrate 1 and a transparent conductive film 2D formed on the surface of the substrate 1. The transparent conductive film 2D is a film constituted by the same transparent conductive material as that of the transparent conductive film 2.

A circuit pattern branching into two branches is formed in the transparent conductive film 2D, and includes, on one branch side thereof, a region 2D1 serving as the first region, a region 2D2 serving as the second region, and a region 2D3 located between the region 2D1 and the region 2D2.

As illustrated in FIG. 10B, in the region 2D3, the transparent conductive film 2D has a corrugated structure in which removed portions 2D31 and remaining portions 2D32 extending in a direction D7 are alternately arranged in a direction D8. The direction D7 is slanted with respect to the direction D8. The direction D8 is a longitudinal direction of the circuit pattern of the transparent conductive film 2D. The removed portions 2D31 are portions where the transparent conductive film 2D has been removed by the laser light L1, and the remaining portions 2D32 are portions where the transparent conductive film 2D remains without being removed by the laser light L1. The scanning direction of the laser light L1 is parallel to the direction D8. This corrugated structure is the LIPSS formed by causing the laser light L1 to make scanning between the region 2D1 and the region 2D2. The removed portions 2D31 are formed so as not to electrically isolate the region 2D1 from the region 2D2.

In the region 2D3, the transparent conductive film 2D has a pattern shape in which the removed portions 2D31 and the remaining portions 2D32 provide a predetermined value of electrical resistance between the region 2D1 and the region 2D2. Specifically, in the same way as the case of the substrate with the transparent conductive film 10A illustrated in FIG. 6, a current flowing through the region 2D3 has a component flowing through a path, such as a path P3 passing through at least one of the remaining portions 2D32, that is longer than a path passing through the region 2D3 at the shortest distance. In addition, the transparent conductive film 2D has a smaller width at the remaining portions 2D32. Accordingly, the electrical resistance value between the region 2D1 and the region 2D2 is higher than that when the corrugated structure is not present in the region 2D3.

In this way, the electrical resistance value between the region 2D1 and the region 2D2 can be adjusted by forming the LIPSS in the region 2D3 between the region 2D1 and the region 2D2. In the same way as in the case of the substrate with the transparent conductive film 10A, the electrical resistance value can increase with an increase in angle of the direction D7 with respect to the direction D8. The region 2D1 can even be electrically isolated from the region 2D2 (in other words, the electrical resistance value can be adjusted to a very high value), for example, by forming the removed portions 2D31 so as to be long enough to cross the region 2D3 in a width direction thereof (in a direction orthogonal to the direction D8).

Sixth Embodiment

Figure 11:
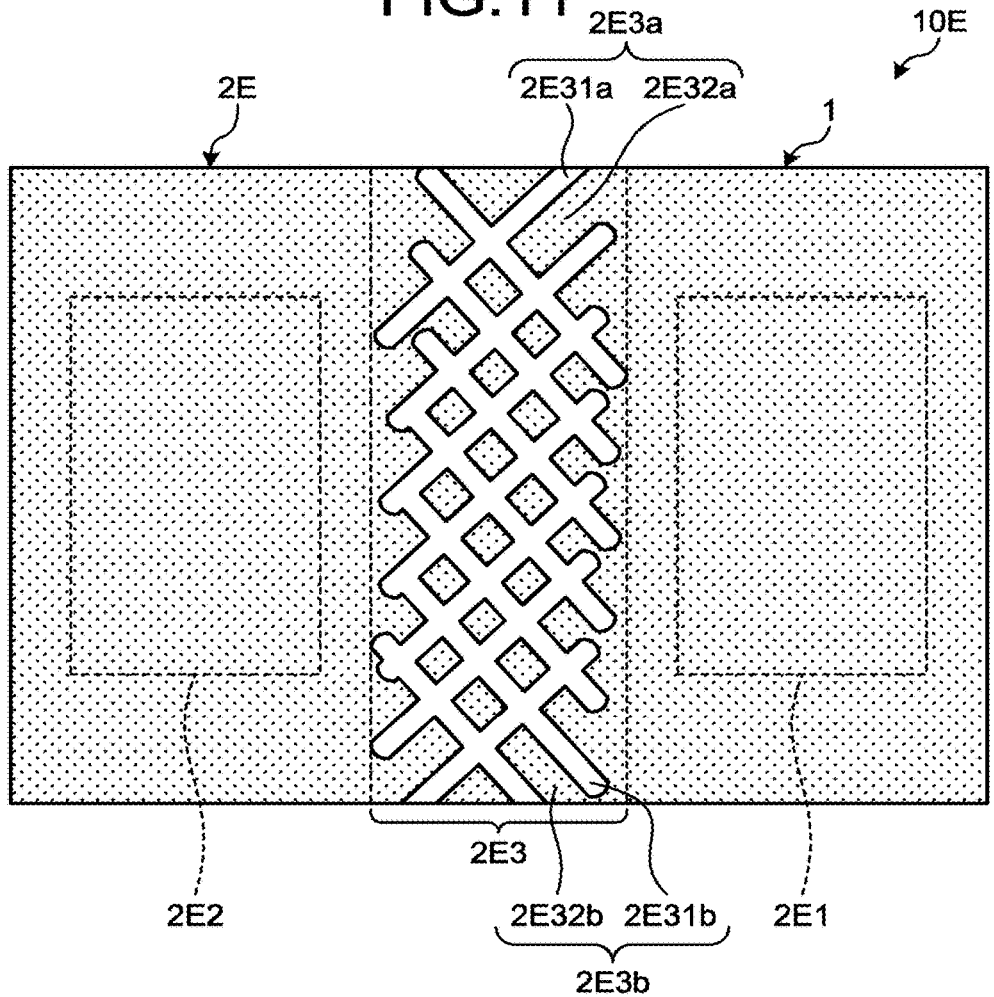
FIG. 11 is a schematic view of a substrate with a transparent conductive film according to a sixth embodiment of the present disclosure.

FIG. 11 is a schematic view of a substrate with a transparent conductive film 10E according to a sixth embodiment of the present disclosure, and is a top view of a part of the substrate with the transparent conductive film 10E.

The substrate with the transparent conductive film 10E includes the substrate 1 and a transparent conductive film 2E formed on the surface of the substrate 1. The transparent conductive film 2E is a film constituted by the same transparent conductive material as that of the transparent conductive film 2.

The transparent conductive film 2E includes a region 2E1 serving as the first region, a region 2E2 serving as the second region, and a region 2E3 located between the region 2E1 and the region 2E2.

In the region 2E3, the transparent conductive film 2E is formed by superimposing two corrugated structures, including a corrugated structure 2E3a constituted by removed portions 2E31a and remaining portions 2E32a extending in a predetermined direction and a corrugated structure 2E3b constituted by removed portions 2E31b and remaining portions 2E32b extending in a direction intersecting the direction in which the removed portions 2E31a and the remaining portions 2E32a extend, such that the directions of extension of the two corrugated structures intersect each other. In this way, the region 2E1 can be electrically isolated from the region 2E2 by forming the two corrugated structures 2E3a and 2E3b serving as the LIPSS so as to be superimposed on each other. As described above, the direction of extension of the removed portions and the remaining portions in each LIPSS can be adjusted by setting the polarization direction of the laser light L1. Accordingly, in the case of manufacturing the substrate with the transparent conductive film 10E, the polarization direction of the laser light L1 in the laser device 101 may be first set to a certain direction to form the corrugated structure 2E3a, and then changed to form the corrugated structure 2E3b. Three or more LIPSS's may be superimposed to form a more complicated corrugated structure.

Seventh Embodiment

Figure 12:
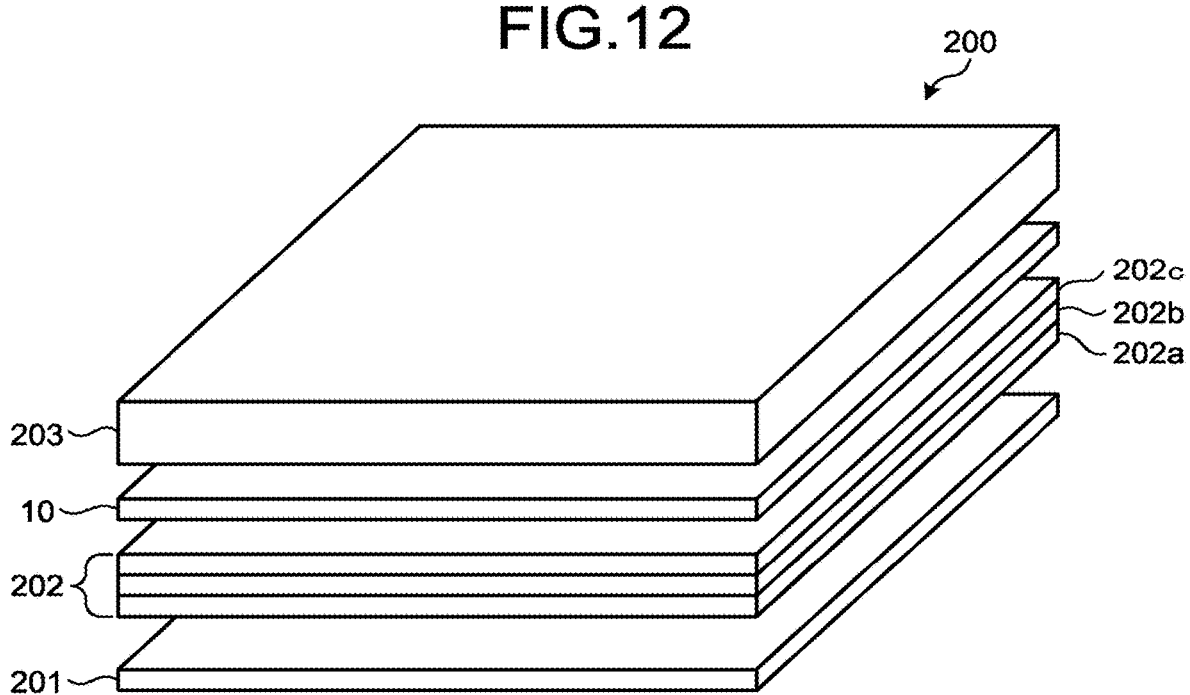
FIG. 12 is a schematic exploded perspective view of a solar cell according to a seventh embodiment of the present disclosure.

FIG. 12 is a schematic exploded perspective view of a solar cell 200 according to a seventh embodiment of the present disclosure. The solar cell 200 includes a back surface electrode layer 201 serving as a positive electrode, a semiconductor layer 202 that generates an electromotive force, the substrate with the transparent conductive film 10 providing a negative electrode, and a glass substrate 203 serving as a cover layer.

The semiconductor layer 202 is constituted by a known semiconductor material, such as single-crystal silicon or amorphous silicon, used in solar cells. The semiconductor layer 202 has what is called a p-i-n structure constituted by sequentially stacking a semiconductor layer 202a having p-type conductivity, a semiconductor layer 202b that is an intrinsic semiconductor, and a semiconductor layer 202c having n-type conductivity.

In the substrate with the transparent conductive film 10, the transparent conductive film serves as the negative electrode, and a corrugated structure (texture) serving as the LIPSS is formed in the transparent conductive film. Such a texture provides effects, such as a reduction of surface reflection of incident sunlight and containment of the sunlight, and contributes to improvement in photoelectric conversion efficiency of the solar cell 200.

The solar cell 200 is provided with the low-cost substrate with the transparent conductive film 10 including the transparent conductive film having a shape suitable for increasing the photoelectric conversion efficiency, and therefore is a low-cost solar cell having suitable characteristics. In particular, while the solar cell 200 is required to have a large area, the substrate with the transparent conductive film 10 is quickly manufactured using the subnano-to-nanosecond pulse laser light, and therefore greatly contributes to a reduction in cost of the solar cell 200.

In the substrate with the transparent conductive film 10 or the substrate with the transparent conductive film 10C according to one of the embodiments described above, when a film other than the protection film 4 or 4C is formed to provide the anchoring effect using the corrugated structure 3 or the corrugated structures of the regions 2C6 to 2C9, the film only needs to be formed on at least the corrugated structure 3 or the corrugated structures of the regions 2C6 to 2C9.

While the laser device 101 of the above-described embodiments includes the polarization controller and the beamformer, one or both of the polarization controller and the beamformer may be disposed outside the laser device.

In the first embodiment, the lower limit value of the width w of the boundary region 1c has been described to be d/cos θ. However, the width w can be set smaller than d/cos θ, for example, by first forming a corrugated structure such as the region 2A3 illustrated in FIG. 6, and then sweeping laser light having a top-hat beam to remove the transparent conductive film including a part of a side portion of the corrugated structure. The term "top-hat beam" refers to a beam that has a shape exemplified by the beam B4 illustrated in FIG. 5D, and has a fluence equal to or higher than the value F2 in the region having the width W4 and a fluence equal to or lower than the value F1 in the other region.

Furthermore, the present disclosure is not limited by the above-described embodiments. The present disclosure also includes configurations obtained by appropriately combining the above-described elements. For example, any one of the substrates with a transparent conductive film according to the above-described embodiments can be used in the solar cell according to the seventh embodiment. The substrate with a transparent conductive film according to the sixth embodiment is particularly preferable, in which the corrugated structures are superimposed to form the texture having the complicated structure. Further effects and modifications can be easily derived by those skilled in the art. Therefore, wider aspects of the present disclosure are not limited to the above-described embodiments, and various modifications are possible.

The present disclosure provides an effect that a transparent conductive film can be shaped at low cost and in a suitable manner.

The invention claimed is:

1. A method for manufacturing a substrate with a transparent conductive film, the method comprising:
   emitting subnano-to-nanosecond laser light to a transparent conductive film formed on a surface of a substrate so as to pattern the transparent conductive film to form a laser-induced periodic surface structure having a corrugated shape in at least a part of the transparent conductive film; and
   controlling a fluence of the subnano-to-nanosecond laser light such that a beam of the subnano-to-nanosecond laser light has a first fluence that removes the transparent conductive film in a central region of the beam, has a second fluence that forms the laser-induced periodic surface structure in a first surrounding region located around the central region, and has third fluence that is incapable of removing the transparent conductive film in a second surrounding region located around the first surrounding region.

2. The method according to claim 1, comprising
   controlling a width of the first surrounding region in the beam of the subnano-to-nanosecond laser light having the second fluence that forms the laser-induced periodic surface structure so as to control a ratio between a width at which the transparent conductive film is removed and a width at which the laser-induced periodic surface structure is formed.

3. The method according to claim 1, wherein the laser-induced periodic surface structure has a structure in which removed portions and remaining portions are alternately arranged in a direction intersecting a predetermined direction, the removed portions extending in the predetermined direction and being portions where the transparent conductive film has been removed, the remaining portions extending in the predetermined direction and being portions where the transparent conductive film remains.

4. The method according to claim 3, comprising
   forming the laser-induced periodic surface structure between a first region and a second region of the transparent conductive film separated from each other so as to adjust an electrical resistance value between the first region and the second region.

5. The method according to claim 1, wherein the controlling the fluence of the subnano-to-nanosecond laser light includes controlling the first fluence to be greater than the second fluence and the second fluence to be greater than the third fluence.

* * * * *